United States Patent
Itai et al.

(10) Patent No.: US 9,150,759 B2
(45) Date of Patent: *Oct. 6, 2015

(54) CHEMICAL MECHANICAL POLISHING COMPOSITION FOR POLISHING SILICON WAFERS AND RELATED METHODS

(71) Applicants: Rohm and Haas Electronic Materials CMP Holdings, Inc., Newark, DE (US); Nitta Haas Incorporated, Osaka (JP)

(72) Inventors: Yasuyuki Itai, Kyoto (JP); Naresh Kumar Penta, Newark, DE (US); Naoko Kawai, Kyoto (JP); Hiroyuki Nakano, Kyoto (JP); Shinichi Haba, Kyoto (JP); Yoshiharu Ota, Kyoto (JP); Takayuki Matsushita, Kyoto (JP); Masashi Teramoto, Kyoto (JP); Sakiko Nakashima, Kyoto (JP); Tomoyuki Toda, Kyoto (JP); Koichi Yoshida, Kyoto (JP); Lee Melbourne Cook, Atglen, PA (US)

(73) Assignees: Rohm and Haas Electronic Materials CMP Holdings, Inc, Newark, DE (US); Nitta Haas Incorporated, Osaka (JP)

( * ) Notice: Subject to any disclaimer, the term of this patent is extended or adjusted under 35 U.S.C. 154(b) by 53 days.

This patent is subject to a terminal disclaimer.

(21) Appl. No.: 14/039,390

(22) Filed: Sep. 27, 2013

(65) Prior Publication Data
US 2015/0093900 A1 Apr. 2, 2015

(51) Int. Cl.
*H01L 21/302* (2006.01)
*C09G 1/02* (2006.01)
*H01L 21/3105* (2006.01)
*H01L 21/306* (2006.01)
*H01L 21/02* (2006.01)

(52) U.S. Cl.
CPC ............ *C09G 1/02* (2013.01); *H01L 21/02024* (2013.01); *H01L 21/30625* (2013.01); *H01L 21/31051* (2013.01)

(58) Field of Classification Search
CPC .......... C09K 3/14; C09K 13/00; C09K 13/02; C09K 13/06; C09K 13/08; H01L 21/31051; H01L 21/30625
USPC .............. 252/79.1, 79.2, 79.3, 79.4; 438/690, 438/691, 692, 693, 694
See application file for complete search history.

(56) References Cited

U.S. PATENT DOCUMENTS

| 5,194,613 | A | * | 3/1993 | King ............................. 544/352 |
| 5,860,848 | A | | 1/1999 | Loncki et al. |
| 8,017,524 | B2 | * | 9/2011 | White et al. .................. 438/692 |
| 8,147,295 | B2 | | 4/2012 | Katoh et al. |
| 8,372,304 | B2 | * | 2/2013 | Yamada et al. ............. 252/79.1 |
| 8,795,548 | B1 | * | 8/2014 | Penta et al. .................. 252/79.1 |
| 2005/0020463 | A1 | * | 1/2005 | Ikemoto et al. .............. 510/175 |
| 2006/0154838 | A1 | * | 7/2006 | Hayashida et al. ........... 510/175 |
| 2006/0293208 | A1 | * | 12/2006 | Egbe et al. ................... 510/407 |
| 2009/0267021 | A1 | * | 10/2009 | Nakajo et al. ................ 252/79.1 |
| 2009/0311947 | A1 | * | 12/2009 | Iwata et al. .................... 451/41 |
| 2012/0295443 | A1 | | 11/2012 | Morinaga et al. |

FOREIGN PATENT DOCUMENTS

WO 2012105651 8/2012

OTHER PUBLICATIONS

Copending U.S. Appl. No. 13/860,830.
Copending U.S. Appl. No. 13/860,806.

* cited by examiner

*Primary Examiner* — Lan Vinh
(74) *Attorney, Agent, or Firm* — Thomas S. Deibert

(57) ABSTRACT

A chemical mechanical polishing composition for polishing silicon wafers is provided, containing: water, optionally, an abrasive; a cation according to formula (I); piperazine or a piperazine derivative according to formula (II); and, a quaternary ammonium compound; wherein the chemical mechanical polishing composition exhibits a pH of 9 to 12. Also provided are methods of making and using the chemical mechanical polishing composition.

8 Claims, No Drawings

CHEMICAL MECHANICAL POLISHING COMPOSITION FOR POLISHING SILICON WAFERS AND RELATED METHODS

The present invention relates generally to the field of chemical mechanical polishing. In particular, the present invention is directed to a chemical mechanical polishing composition and method for chemical mechanical polishing of silicon wafers.

Silicon wafers for use in the semiconductor industry typically require a very high degree of surface perfection before they can be utilized in device manufacture. The silicon wafer surfaces are produced by chemical mechanical polishing of the wafer surfaces with a polishing slurry. Polishing slurries conventionally consist of a composition that includes a concentration of submicron abrasive particles. The silicon wafer is bathed or rinsed in the polishing slurry in combination with a polishing pad which is pressed against the surface of the silicon wafer and rotated such that the abrasive particles in the polishing slurry are pressed against the surface of the silicon wafer under a load. The lateral motion of the polishing pad causes the abrasive particles in the polishing slurry to move across the silicon wafer surface, resulting in wear, or volumetric removal of the material from the surface of the silicon wafer. Ideally, this process results in the selective removal of projecting surface features so that when the process is finished a perfectly planar surface is produced down to the finest level of detail.

The silicon polishing process that are conventionally practiced in the industry consist of two or more steps. In the first polish step, (i.e., coarse polish step) gross defects remaining from wafer sawing and shaping operations are removed. The wafer surface appears smooth and specular following the first polish step, but still contains numerous minute defects. These minute defects are removed by a subsequent final polish step that removes a small amount of material from the surface, but act to polish away the surface defects. The present invention relates to solutions which are particularly useful for the first polish step through the final polish step.

The number and permissible size of any surface imperfections on the silicon wafer surface remaining after polishing is continually decreasing. Some of the most critical material specifications for silicon wafers are: the surface metals content, the front surface micro roughness and the total particle per unit area.

One polishing composition for final polishing silicon wafers is disclosed in U.S. Pat. No. 5,860,848 to Loncki et al. Loncki et al. disclose a polishing composition comprising: water, submicron silica particles at 0.02 to 0.5 percent by weight in said composition, a salt at a concentration of 100 to 1,000 ppm, an amine compound at a concentration sufficient to effect a composition pH of 8 to 11, and a polyelectrolyte dispersion agent at a concentration of 20 to 500 ppm, wherein said composition has a total sodium and potassium content below about 1 ppm, and an iron, nickel, and copper content each below about 0.1 ppm, all ppm being parts per million by weight of said composition.

There nevertheless remains a need for new chemical mechanical polishing compositions for final polishing silicon wafers. Particularly, there is a need for new chemical mechanical polishing compositions for stock silicon wafer polishing (i.e., first step) through the final polishing of the silicon wafers which exhibit a silicon removal rate of ≥300 nm/min.

The present invention provides a chemical mechanical polishing composition for polishing a silicon wafer, comprising: water, optionally, an abrasive; a cation according to formula (I):

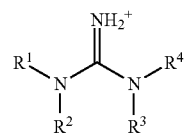

(I)

wherein $R^1$, $R^2$, $R^3$, $R^4$ are independently selected from the group consisting of a hydrogen and a $C_{1-10}$ alkyl group, a $C_{1-10}$ aryl group, a $C_{1-10}$ arylalkyl group and a $C_{1-10}$ alkylaryl group; and, piperazine or a piperazine derivative according to formula (II)

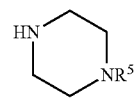

(II)

wherein $R^5$ is selected from the group consisting of a hydrogen, a $C_{1-10}$ alkyl group, a $C_{1-10}$ aryl group, a $C_{1-10}$ arylalkyl group and a $C_{1-10}$ alkylaryl group; and, a quaternary ammonium compound selected from the group consisting of tetramethyl ammonium hydroxide, tetraethyl ammonium hydroxide, tetrapropyl ammonium hydroxide, tetraisopropyl ammonium hydroxide, tetracyclopropyl ammonium hydroxide, tetrabutyl ammonium hydroxide, tetraisobutyl ammonium hydroxide, tetra tert-butyl ammonium hydroxide, tetra sec-butyl ammonium hydroxide, tetracyclobutyl ammonium hydroxide, tetrapentyl ammonium hydroxide, tetracyclopentyl ammonium hydroxide, tetrahexyl ammonium hydroxide, tetracyclohexyl ammonium hydroxide, and mixtures thereof; wherein the chemical mechanical polishing composition exhibits a pH of 9 to 12; and, wherein the chemical mechanical polishing composition exhibits a silicon removal rate of at least 300 nm/min.

The present invention provides a chemical mechanical polishing composition for polishing a silicon wafer, comprising: water, an abrasive; a cation according to formula (I):

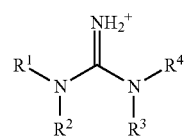

(I)

wherein $R^1$, $R^2$, $R^3$, $R^4$ are independently selected from the group consisting of a hydrogen and a $C_{1-10}$ alkyl group, a $C_{1-10}$ aryl group, a $C_{1-10}$ arylalkyl group and a $C_{1-10}$ alkylaryl group; and, piperazine or a piperazine derivative according to formula (II)

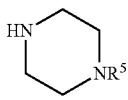

wherein $R^5$ is selected from the group consisting of a hydrogen, a $C_{1-10}$ alkyl group, a $C_{1-10}$ aryl group, a $C_{1-10}$ arylalkyl group and a $C_{1-10}$ alkylaryl group; and, a quaternary ammonium compound selected from the group consisting of tetramethyl ammonium hydroxide, tetraethyl ammonium hydroxide, tetrapropyl ammonium hydroxide, tetraisopropyl ammonium hydroxide, tetracyclopropyl ammonium hydroxide, tetrabutyl ammonium hydroxide, tetraisobutyl ammonium hydroxide, tetra tert-butyl ammonium hydroxide, tetra sec-butyl ammonium hydroxide, tetracyclobutyl ammonium hydroxide, tetrapentyl ammonium hydroxide, tetracyclopentyl ammonium hydroxide, tetrahexyl ammonium hydroxide, tetracyclohexyl ammonium hydroxide, and mixtures thereof; wherein the chemical mechanical polishing composition exhibits a pH of 10 to 12; wherein the chemical mechanical polishing composition exhibits a silicon removal rate of at least 300 nm/min; and, wherein the chemical mechanical polishing composition contains <1 ppm of polymers.

The present invention provides a chemical mechanical polishing composition for polishing a silicon wafer, comprising: water, a colloidal silica abrasive; a cation according to formula (I):

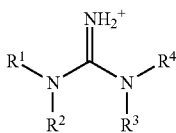

wherein $R^1$, $R^2$, $R^3$, $R^4$ are each a hydrogen; and, piperazine or a piperazine derivative according to formula (II)

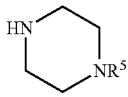

wherein $R^5$ is a hydrogen; and, a tetramethyl ammonium hydroxide; wherein the chemical mechanical polishing composition exhibits a pH of 9 to 12; and, wherein the chemical mechanical polishing composition exhibits a silicon removal rate of at least 300 nm/min.

The present invention provides a chemical mechanical polishing composition for polishing a silicon wafer, comprising: water, a colloidal silica abrasive; a cation according to formula (I):

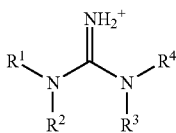

wherein $R^1$, $R^2$, $R^3$, $R^4$ are each a hydrogen; and, piperazine or a piperazine derivative according to formula (II)

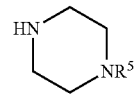

wherein $R^5$ is a hydrogen; and, a tetramethyl ammonium hydroxide; wherein the chemical mechanical polishing composition exhibits a pH of 9 to 12; wherein the chemical mechanical polishing composition exhibits a silicon removal rate of at least 300 nm/min; and, wherein the chemical mechanical polishing composition contains <1 ppm of polymers.

The present invention provides a method of making the chemical mechanical polishing composition of the present invention, comprising: providing a water; optionally, providing an abrasive; providing a source of cations according to formula (I)

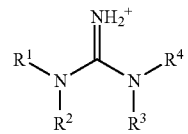

wherein $R^1$, $R^2$, $R^3$, $R^4$ are independently selected from the group consisting of a hydrogen and a $C_{1-10}$ alkyl group, a $C_{1-10}$ aryl group, a $C_{1-10}$ arylalkyl group and a $C_{1-10}$ alkylaryl group; and, providing a source of piperazine or a piperazine derivative according to formula (II)

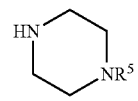

wherein $R^5$ is selected from the group consisting of a hydrogen, a $C_{1-10}$ alkyl group, a $C_{1-10}$ aryl group, a $C_{1-10}$ arylalkyl group and a $C_{1-10}$ alkylaryl group; providing a quaternary ammonium compound selected from the group consisting of tetramethyl ammonium hydroxide, tetraethyl ammonium hydroxide, tetrapropyl ammonium hydroxide, tetraisopropyl ammonium hydroxide, tetracyclopropyl ammonium hydroxide, tetrabutyl ammonium hydroxide, tetraisobutyl ammonium hydroxide, tetra tert-butyl ammonium hydroxide, tetra sec-butyl ammonium hydroxide, tetracyclobutyl ammonium hydroxide, tetrapentyl ammonium hydroxide, tetracyclopentyl ammonium hydroxide, tetrahexyl ammonium hydroxide, tetracyclohexyl ammonium hydroxide, and mixtures thereof; and, combining the water, the optionally provided abrasive, the source of cations according to formula (I) and the source of piperazine or piperazine derivative according to formula (II) to form a combination; adding the quaternary ammonium compound to the combination to form the chemical mechanical polishing composition; wherein the chemical mechanical polishing composition exhibits a pH of 9 to 12.

The present invention provides a method of polishing a silicon wafer, comprising: providing a silicon wafer; providing a chemical mechanical polishing composition according to the present invention; providing a chemical mechanical polishing pad; providing a polishing machine; installing the silicon wafer and the chemical mechanical polishing pad in the polishing machine; creating dynamic contact at an interface between the chemical mechanical polishing pad and the silicon wafer with a down force of ≥0.5 kPa; and dispensing the chemical mechanical polishing composition onto the chemical mechanical polishing pad at or near the interface between the chemical mechanical polishing pad and the silicon wafer; wherein the chemical mechanical polishing composition has a pH of 9 to 12.

The present invention provides a method of polishing a silicon wafer, comprising: providing a silicon wafer, providing a chemical mechanical polishing composition according to the present invention; providing a chemical mechanical polishing pad; providing a polishing machine; installing the silicon wafer and the chemical mechanical polishing pad in the polishing machine; creating dynamic contact at an interface between the chemical mechanical polishing pad and the silicon wafer with a down force; and, dispensing the chemical mechanical polishing composition onto the chemical mechanical polishing pad at or near the interface between the chemical mechanical polishing pad and the silicon wafer, wherein the chemical mechanical polishing composition has a pH of 10 to 12; wherein the chemical mechanical polishing composition exhibits a silicon removal rate of at least 300 nm/min with a platen speed of 115 revolutions per minute, a carrier speed of 100 revolutions per minute, a chemical mechanical polishing composition flow rate of 200 ml/min, and a nominal down force of 29.4 kPa on a polishing machine with a 500 mm platen, wherein the chemical mechanical polishing pad used comprises a polyurethane impregnated, non-woven polyester felt pad.

DETAILED DESCRIPTION

The chemical mechanical polishing composition of the present invention is useful for polishing silicon wafers. The chemical mechanical polishing composition of the present invention preferably contains an abrasive and a silicon removal rate enhancing, synergistic, combination of (i) a cation according to formula (I); and, (ii) piperazine or a piperazine derivative according to formula (II); wherein the pH of the chemical mechanical polishing composition is adjusted to a pH of 9 to 12 with the addition of a quaternary ammonium compound.

The term "stable silicon removal rate" as used herein and in the appended claims means that the silicon removal rate exhibited by a chemical mechanical polishing composition, under the polishing conditions set forth herein in the Examples, changes by ≤10% for a series of at least eight consecutive 200 mm silicon wafers (without pad brushing) for a period of at least 15 minutes per wafer. That is, the following expression will be satisfied when a chemical mechanical polishing composition exhibits a stable silicon removal rate:

$(RR_H-RR_L)/RR_L*100 \leq 10$ wherein $RR_H$ is the highest silicon removal rate exhibited by the chemical mechanical polishing composition over the series of at least eight consecutive 200 mm silicon wafers, and wherein $RR_L$ is the lowest silicon removal rate exhibited by the chemical mechanical polishing composition over the series of at least eight consecutive 200 mm silicon wafers.

The water contained in the chemical mechanical polishing composition of the present invention, is preferably at least one of deionized and distilled to limit incidental impurities.

Preferably, the abrasive used in the chemical mechanical polishing composition of the present invention is selected from the group consisting of inorganic oxides, inorganic hydroxides, inorganic hydroxide oxides, metal borides, metal carbides, metal nitrides and mixtures comprising at least one of the foregoing. Suitable inorganic oxides include, for example, silica ($SiO_2$), alumina ($Al_2O_3$), zirconia ($ZrO_2$), ceria ($CeO_2$), manganese oxide ($MnO_2$), titanium oxide ($TiO_2$) or combinations comprising at least one of the foregoing oxides. Modified forms of these inorganic oxides, such as, inorganic coated particles can also be utilized if desired. Suitable metal carbides, boride and nitrides include, for example, silicon carbide, silicon nitride, silicon carbonitride (SiCN), boron carbide, tungsten carbide, zirconium carbide, aluminum boride, tantalum carbide, titanium carbide, or combinations comprising at least one of the foregoing metal carbides, boride and nitrides. Preferably, the abrasive is a colloidal silica abrasive. Preferably, the colloidal silica abrasive contains at least one of fumed silica, precipitated silica and agglomerated silica.

Preferably, the abrasive used in the chemical mechanical polishing composition of the present invention has an average particle size of ≤100 nm (more preferably, 1 to 100 nm). More preferably, the abrasive used in the chemical mechanical polishing composition of the present invention is a colloidal silica abrasive having an average particle size of ≤100 nm (preferably, 1 to 100 nm; more preferably, 10 to 80 nm; still more preferably, 20 to 80 nm; most preferably, 20 to 30 nm).

Preferably, the chemical mechanical polishing composition of the present invention contains 0.00001 to 0.5 wt % (more preferably, 0.005 to 0.1 wt %; still more preferably, 0.0075 to 0.075 wt %; most preferably, 0.009 to 0.011 wt %) of an abrasive. More preferably, the chemical mechanical polishing composition of the present invention preferably contains 0.00001 to 0.5 wt % (more preferably, 0.005 to 0.1 wt/o; still more preferably, 0.0075 to 0.075 wt %; most preferably, 0.009 to 0.011 wt %) of a colloidal silica abrasive. Most preferably, the chemical mechanical polishing composition of the present invention preferably contains 0.00001 to 0.5 wt % (more preferably, 0.005 to 0.1 wt %; still more preferably, 0.0075 to 0.075 wt %; most preferably, 0.009 to 0.011 wt %) of a colloidal silica abrasive, wherein the colloidal silica abrasive exhibits an average particle size of ≤100 nm (preferably, 1 to 100 nm; more preferably, 20 to 80 nm; most preferably, 20 to 30 nm).

Preferably, the chemical mechanical polishing composition of the present invention contains 0.0005 to 10 moles/L (more preferably, 0.005 to 1 moles/L; still more preferably, 0.01 to 0.5 moles/L; most preferably, 0.02 to 0.03 moles/L) of a cation according to formula (I)

wherein $R^1$, $R^2$, $R^3$, $R^4$ are independently selected from the group consisting of a hydrogen and a $C_{1-10}$ alkyl group, a $C_{1-10}$ aryl group, a $C_{1-10}$ arylalkyl group and a $C_{1-10}$ alkylaryl group (preferably, a hydrogen, a $C_{1-10}$ alkyl group, a $C_6$ aryl group and a $C_7$ alkylaryl group; more preferably, a hydrogen, a methyl group and a phenyl group). Most preferably, the chemical mechanical polishing composition of the present invention contains 0.0005 to 10 moles/L (more preferably, 0.005 to 1 moles/L; still more preferably, 0.01 to 0.5 moles/L; most preferably, 0.02 to 0.03 moles/L) of a cation according to formula (I), wherein the cation according to formula (I) is according to formula (Ia)

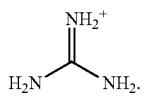

(Ia)

Preferably, the chemical mechanical polishing composition of the present invention contains 0.0005 to 10 moles/L (more preferably, 0.001 to 1 moles/L; still more preferably, 0.01 to 0.5 moles/L; most preferably, 0.01 to 0.04 moles/L) of piperazine or a piperazine derivative according to formula (II)

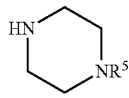

(II)

wherein $R^5$ is selected from the group consisting of a hydrogen, a $C_{1-10}$ alkyl group, a $C_{1-10}$ aryl group, a $C_{1-10}$ arylalkyl group and a $C_{1-10}$ alkylaryl group (preferably, a hydrogen, a $C_{1-10}$ alkyl group, a $C_6$ aryl group and a $C_7$ alkylaryl group; more preferably, a hydrogen, a methyl group and a phenyl group). Most preferably, the chemical mechanical polishing composition of the present invention contains 0.0005 to 10 moles/L (more preferably, 0.001 to 1 moles/L; still more preferably, 0.01 to 0.5 moles/L; most preferably, 0.01 to 0.04 moles/L) of piperazine.

The chemical mechanical polishing composition of the present invention provides efficacy over a pH of 9 to 12. Preferably, the chemical mechanical polishing composition of the present invention exhibits a pH of 10 to 12 (more preferably, a pH of 10.5 to 11.5; most preferably, a pH of 10.8 to 11). To achieve the desired pH, the chemical mechanical polishing composition of the present invention contains, as an initial component, a quaternary ammonium compound; wherein the quaternary ammonium compound is provided in a sufficient concentration to provide the chemical mechanical polishing composition with a pH of 9 to 12 (preferably, a pH of 10 to 12; more preferably, a pH of 10.5 to 11.5; most preferably, a pH of 10.8 to 11). Preferably, the quaternary ammonium compound is selected from the group consisting of tetramethyl ammonium hydroxide, tetraethyl ammonium hydroxide, tetrapropyl ammonium hydroxide, tetraisopropyl ammonium hydroxide, tetracyclopropyl ammonium hydroxide, tetrabutyl ammonium hydroxide, tetraisobutyl ammonium hydroxide, tetra tert-butyl ammonium hydroxide, tetra sec-butyl ammonium hydroxide, tetracyclobutyl ammonium hydroxide, tetrapentyl ammonium hydroxide, tetracyclopentyl ammonium hydroxide, tetrahexyl ammonium hydroxide, tetracyclohexyl ammonium hydroxide, and mixtures thereof. Most preferably, the quaternary ammonium compound is tetramethyl ammonium hydroxide (TMAH). Preferably, the chemical mechanical polishing composition comprises, as an initial component: 0.0001 to 1 wt % (preferably 0.005 to 1 wt %, more preferably 0.005 to 0.75 wt %; most preferably 0.005 to 0.05 wt %) of the quaternary ammonium compound.

The chemical mechanical polishing composition of the present invention preferably further comprises ions selected from the group consisting of carbonate ions; phosphate ions and halide ions. More preferably, the chemical mechanical polishing composition of the present invention contains 0.00025 to 5 moles/L (more preferably, 0.0025 to 0.5 moles/L) of ions selected from the group consisting of carbonate ions; phosphate ions and halide ions. Still more preferably, the chemical mechanical polishing composition of the present invention contains 0.00025 to 5 moles/L (more preferably, 0.0025 to 0.5 moles/L; still more preferably, 0.005 to 0.25 moles/L; most preferably, 0.01 to 0.015 moles/L) of ions selected from the group consisting of carbonate ions and phosphate ions. Most preferably, the chemical mechanical polishing composition of the present invention contains 0.00025 to 5 moles/L (more preferably, 0.0025 to 0.5 moles/L; still more preferably, 0.005 to 0.25 moles/L; most preferably, 0.01 to 0.015 moles/L) of carbonate ions.

The chemical mechanical polishing composition of the present invention preferably further comprises halide ions (preferably, chloride ions). More preferably, the chemical mechanical polishing composition comprises 0.0005 to 10 moles/L (more preferably, 0.005 to 1 moles/L; still more preferably, 0.01 to 0.5 moles/L; most preferably, 0.02 to 0.03 moles/L) of halide ions (preferably, chloride ions).

The chemical mechanical polishing composition of the present invention preferably contains <1 ppm (more preferably, <0.1 ppm; still more preferably, <0.0000001 ppm) of polymers. Most preferably, the chemical mechanical polishing composition of the present invention is free of polymers (e.g., water soluble polymers, such as cellulose based polymers; and polyelectrolytes, such as hydroxyethyl cellulose, polyvinyl alcohol, polyacrylamide, polyvinyl pyrrolidone, polyethylene glycol, polypropylene glycol, polyethylene oxide, polyacrylic acid). The term "free of polymers" as used herein and in the appended claims means that no polymers are detectable in the chemical mechanical polishing composition.

The method of making the chemical mechanical polishing composition of the present invention, preferably comprises: providing a water (preferably, a water that is at least one of deionized and distilled; more preferably, a water that is both deionized and distilled); providing an abrasive (preferably, a colloidal silica abrasive; more preferably, a colloidal silica abrasive having an average particle size of ≤100 nm (preferably, 1 to 100 nm; more preferably, 20 to 80 nm; most preferably, 20 to 30 nm)); providing a source of cations according to formula (I)

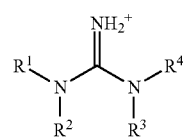

(I)

wherein $R^1$, $R^2$, $R^3$, $R^4$ are independently selected from the group consisting of a hydrogen and a $C_{1-10}$ alkyl group, a $C_{1-10}$ aryl group, a $C_{1-10}$ arylalkyl group and a $C_{1-10}$ alkylaryl group (preferably, a hydrogen, a $C_{1-10}$ alkyl group, a $C_6$ aryl group and a $C_7$ alkylaryl group; more preferably, a hydrogen, a methyl group and a phenyl group; most preferably, a hydrogen (i.e., wherein the anion is

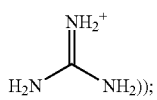

and, providing a source of piperazine or a piperazine derivative according to formula (II)

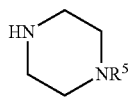

wherein $R^5$ is selected from the group consisting of a hydrogen, a $C_{1-10}$ alkyl group, a $C_{1-10}$ aryl group, a $C_{1-10}$ arylalkyl group and a $C_{1-10}$ alkylaryl group (preferably, a hydrogen, a $C_{1-10}$ alkyl group, a $C_6$ aryl group and a $C_7$ alkylaryl group; more preferably, a hydrogen, a methyl group and a phenyl group; most preferably, a hydrogen); providing a quaternary ammonium compound; combining the water, the source of cations according to formula (I) and the source of piperazine or piperazine derivative according to formula (II) to form a combination; and, adding the quaternary ammonium compound to the combination to form the chemical mechanical polishing composition; wherein the chemical mechanical polishing composition exhibits a pH of 9 to 12 (preferably, a pH of 10 to 12; more preferably, a pH of 10.5 to 11.5; most preferably, a pH of 10.8 to 11). Preferably, in the method of making the chemical mechanical polishing composition of the present invention, the source of cations according to formula (I) is selected from the group consisting of guanidine carbonate (i.e., $(H_2NC(=NH)NH_2)_2.H_2CO_3$); guanidine phosphate (i.e., $(H_2NC(=NH)NH_2)_2.H_3PO_4$); and guanidine hydrochloride (i.e., $H_2NC(=NH)NH_2.HCl$). Preferably, in the method of making the chemical mechanical polishing composition of the present invention, the source of cations according to formula (I) is selected from the group consisting of guanidine carbonate (i.e., $(H_2NC(=NH)NH_2)_2.H_2CO_3$); and, guanidine phosphate (i.e., $(H_2NC(=NH)NH_2)_2.H_3PO_4$). Preferably, in the method of making the chemical mechanical polishing composition of the present invention, the source of piperazine or piperazine derivative according to formula (II) is piperazine dihydrochloride hydrate.

The method of polishing a silicon wafer of the present invention preferably comprises: providing a silicon wafer, providing a chemical mechanical polishing composition according to the present invention; providing a chemical mechanical polishing pad; providing a polishing machine; installing the silicon wafer and the chemical mechanical polishing pad in the polishing machine; creating dynamic contact at an interface between the chemical mechanical polishing pad and the silicon wafer with a down force of ≥0.5 kPa (preferably 0.5 to 100 kPa; more preferably, 0.7 to 50 kPa; still more preferably, 6 to 35 kPa; most preferably, 20 to 30 kPa); and dispensing the chemical mechanical polishing composition onto the chemical mechanical polishing pad at or near the interface between the chemical mechanical polishing pad and the silicon wafer, wherein the chemical mechanical polishing composition has a pH of 9 to 12 (preferably, 10 to 12; more preferably 10.5 to 11.5; most preferably 10.8 to 11); wherein the chemical mechanical polishing composition exhibits a silicon removal rate of at least 300 nm/min with a platen speed of 115 revolutions per minute, a carrier speed of 100 revolutions per minute, a chemical mechanical polishing composition flow rate of 200 ml/min, and a nominal down force of 29.4 kPa on a polishing machine with a 500 mm platen, wherein the chemical mechanical polishing pad used comprises a polyurethane impregnated, non-woven polyester felt pad. Preferably, the chemical mechanical polishing composition used in the method of the present invention exhibits a silicon removal rate from 200 mm silicon wafers of at least 675 nm/min (more preferably, at least 700 nm/min; most preferably, at least 700 nm/min) with a platen speed of 115 revolutions per minute, a carrier speed of 100 revolutions per minute, a chemical mechanical polishing composition flow rate of 200 ml/min, and a nominal down force of 29.4 kPa on a polishing machine with a 500 mm platen, wherein the chemical mechanical polishing pad used comprises a polyurethane impregnated, non-woven polyester felt pad. More preferably, the chemical mechanical polishing composition used in the method of the present invention exhibits a stable silicon removal rate from 200 mm silicon wafers of at least 675 nm/min (most preferably, at least 700 nm/min) when polishing at least eight consecutive silicon wafers (without pad brushing) for a period of at least 15 minutes per wafer using a platen speed of 115 revolutions per minute, a carrier speed of 100 revolutions per minute, a chemical mechanical polishing composition flow rate of 200 ml/min, and a nominal down force of 29.4 kPa on a polishing machine with a 500 mm platen, wherein the chemical mechanical polishing pad used comprises a polyurethane impregnated, non-woven polyester felt pad. Most preferably, the chemical mechanical polishing composition used in the method of the present invention exhibits a stable silicon removal rate from 200 mm silicon wafers of at least 675 nm/min (most preferably, at least 700 nm/min) when polishing at least seven consecutive silicon wafers (without pad brushing) for a period of at least 30 minutes per wafer using a platen speed of 115 revolutions per minute, a carrier speed of 100 revolutions per minute, a chemical mechanical polishing composition flow rate of 200 ml/min, and a nominal down force of 29.4 kPa on a polishing machine with a 500 mm platen, wherein the chemical mechanical polishing pad used comprises a polyurethane impregnated, non-woven polyester felt pad.

Some embodiments of the present invention will now be described in detail in the following Examples.

Comparative Examples C1-C20 and Example 1

Chemical Mechanical Polishing Composition Preparation

The chemical mechanical polishing compositions used in the polishing Comparative Examples PC1-PC20 and Example P1 (namely, chemical mechanical polishing compositions C1-C20 and 1, respectively) were prepared by combining the components in the amounts listed in TABLE 1 and adjusting the pH of the compositions to the final pH listed in TABLE 1 with the pH adjustor noted in TABLE 1.

TABLE 1

| Ex # | Abrasive[1] (in ppm) | Guanidine carbonate[2] (wt %) | Piperazine hydrochloride hydrate[3] (wt %) | pH adjusting agent | pH |
|---|---|---|---|---|---|
| C1 | 0 | 0.09 | 0 | KOH | 10 |
| C2 | 0 | 0 | 0.16 | KOH | 10 |
| C3 | 0 | 0.045 | 0 | KOH | 10 |
| C4 | 0 | 0 | 0.8 | KOH | 10 |

TABLE 1-continued

| Ex # | Abrasive[1] (in ppm) | Guanidine carbonate[2] (wt %) | Piperazine hydrochloride hydrate[3] (wt %) | pH adjusting agent | pH |
|---|---|---|---|---|---|
| C5  | 0   | 0.9  | 0    | KOH  | 10   |
| C6  | 0   | 0    | 1.59 | KOH  | 10   |
| C7  | 0   | 0.05 | 0.08 | KOH  | 10   |
| C8  | 0   | 0.23 | 0.4  | KOH  | 10   |
| C9  | 0   | 0.45 | 0.8  | KOH  | 10   |
| C10 | 500 | 0    | 0.1  | KOH  | 10   |
| C11 | 500 | 0    | 0.49 | KOH  | 10   |
| C12 | 500 | 0    | 1    | KOH  | 10   |
| C13 | 500 | 0.1  | 0    | KOH  | 10   |
| C14 | 500 | 0.5  | 0    | KOH  | 10   |
| C15 | 500 | 0.1  | 0    | KOH  | 10   |
| C16 | 500 | 0.05 | 0.05 | KOH  | 10   |
| C17 | 500 | 0.25 | 0.25 | KOH  | 10   |
| C18 | 500 | 0.5  | 0.49 | KOH  | 10   |
| C19 | 100 | 0.25 | 0.25 | KOH  | 10.9 |
| 1   | 100 | 0.25 | 0.25 | TMAH | 10.9 |

[1]Klebosol ™ 1598-B25 slurry manufactured by AZ Electronic Materials, available from The Dow Chemical Company
[2]guanidine carbonate with linear formula $NH_2C(=NH)NH_2 \cdot \frac{1}{2}H_2CO_3$ and molecular weight 90.08 (available from Sigma-Aldrich)
[3]piperazine dihydrochloride hydrate with empirical formula $C_4H_{10}N_2 \cdot 2HCl \cdot xH_2O$ and molecular weight 159.06 (anhydrous basis) (available from Sigma-Aldrich)

Comparative Examples PC1-PC9

Chemical Mechanical Polishing Experiments

Silicon removal rate polishing tests were performed using the chemical mechanical polishing compositions prepared according to Comparative Examples C1-C9. Specifically, the silicon removal rate for each of the chemical mechanical polishing compositions C1-C9 identified in TABLE 1. These silicon removal rate experiments were performed using eight inch Si(100) wafers, which were pre-etched in a 0.5 wt % hydrofluoric acid solution for 90 seconds, using a Strasbaugh Model 6EC polisher and a Suba1200™ polyurethane impregnated, non-woven polyester felt pad (commercially available from Rohm and Haas Electronic Materials CMP Inc.) with a down force of 27.58 kPa (4 psi), a chemical mechanical polishing composition flow rate of 200 ml/min, a table rotation speed of 63 rpm and a carrier rotation speed of 57 rpm. The silicon removal rates were determined from a measurement of the weight loss from the individual Si(100) wafers from the polishing. The results of the silicon removal rate experiments are provided in TABLE 2.

TABLE 2

| Polish Example # | Polishing Composition | Si(100) removal rate (nm/min) |
|---|---|---|
| PC1 | C1 | 357 |
| PC2 | C2 | 377 |
| PC3 | C3 | 459 |
| PC4 | C4 | 425 |
| PC5 | C5 | 489 |
| PC6 | C6 | 461 |
| PC7 | C7 | 404 |
| PC8 | C8 | 481 |
| PC9 | C9 | 504 |

Comparative Examples PC10-PC18

Chemical Mechanical Polishing Experiments

Silicon removal rate polishing tests were performed using the chemical mechanical polishing compositions prepared according to Comparative Examples C10-C18. Specifically, the silicon removal rate for each of the chemical mechanical polishing compositions C10-C18 identified in TABLE 1. These silicon removal rate experiments were performed using eight inch Si(100) wafers (having a native oxide on the surface) using a Strasbaugh Model 6EC polisher and a Suba1200™ polyurethane impregnated, non-woven polyester felt pad (commercially available from Rohm and Haas Electronic Materials CMP Inc.) with a down force of 27.58 kPa (4 psi), a chemical mechanical polishing composition flow rate of 200 ml/min, a table rotation speed of 63 rpm and a carrier rotation speed of 57 rpm. The silicon removal rates were determined from a measurement of the weight loss from the individual Si(100) wafers from the polishing. The results of the silicon removal rate experiments are provided in TABLE 3.

TABLE 3

| Polish Example # | Polishing Compostion | Si(100) removal rate (nm/min) |
|---|---|---|
| PC10 | C10 | 351 |
| PC11 | C11 | 448 |
| PC12 | C12 | 489 |
| PC13 | C13 | 364 |
| PC14 | C14 | 473 |
| PC15 | C15 | 518 |
| PC16 | C16 | 391 |
| PC17 | C17 | 503 |
| PC18 | C18 | 546 |

Comparative Example PC19 and Example P1

Chemical Mechanical Polishing Experiments

Silicon removal rate polishing tests were performed using the chemical mechanical polishing compositions prepared according to Comparative Example C19 and Example 1. Specifically, the silicon removal rate for each of the chemical mechanical polishing compositions C19 and 1 identified in TABLE 1. These silicon removal rate experiments were performed using multiple consecutive eight inch Si(100) wafers (having a native oxide on the surface) using a 20" platen polisher (Strasbaugh) and a Suba840™ polyurethane impregnated, non-woven polyester felt pad (commercially available from Nitta Haas Inc.) with a down force of 29.4 kPa, a chemical mechanical polishing composition flow rate of 200 ml/min, a table rotation speed of 115 rpm and a carrier rotation speed of 100 rpm. The silicon removal rates were determined from a measurement of the weight loss from the individual Si(100) wafers from the polishing. The results of the silicon removal rate experiments are provided in TABLE 4.

TABLE 4

| Polish Example # | Polish Time (in min.) | Wafer Count in series of consecutive wafers | Si(100) removal rate (nm/min) |
|---|---|---|---|
| PC19 | 30 | 1*  | 700 |
|      | 30 | 2*  | 719 |
|      | 30 | 3   | 538 |
|      | 30 | 4   | 699 |
|      | 30 | 5   | 698 |
|      | 30 | 6   | 661 |
|      | 30 | 7   | 656 |
|      | 30 | 8** | 653 |
|      | 30 | 9   | 670 |

TABLE 4-continued

| Polish Example # | Polish Time (in min.) | Wafer Count in series of consecutive wafers | Si(100) removal rate (nm/min) |
|---|---|---|---|
|  | 30 | 10 | 657 |
|  | 30 | 11 | 660 |
|  | 30 | 12 | 625 |
|  | 30 | 13 | 636 |
|  | 30 | 14 | 602 |
| P1 | 30 | 1* | 709 |
|  | 30 | 2* | 744 |
|  | 30 | 3 | 755 |
|  | 30 | 4 | 751 |
|  | 30 | 5 | 758 |
|  | 30 | 6 | 739 |
|  | 30 | 7 | 745 |
|  | 30 | 8 | 720 |
|  | 30 | 9 | 714 |
|  | 30 | 10 | 691 |
|  | 30 | 11** | 725 |
|  | 30 | 12 | 725 |
|  | 30 | 13 | 734 |
|  | 30 | 14 | 724 |
|  | 30 | 15 | 717 |

*Denotes the silicon wafer was pre-etched in a 2 wt % hydrofluoric acid solution for 30 seconds before installing in the polisher.
**Denotes that the polishing pad was conditioned with a brush before commencing polishing on the silicon wafer.

Example P2

Chemical Mechanical Polishing Experiment

Silicon removal rate polishing test was performed using the chemical mechanical polishing composition prepared according to Example 1. Specifically, the silicon removal rate for the chemical mechanical polishing composition 1 identified in TABLE 1. The silicon removal rate experiment was performed using multiple consecutive eight inch Si(100) wafers (having a native oxide on the surface) using a 20" platen polisher (Strasbaugh) and a Suba840™ polyurethane impregnated, non-woven polyester felt pad (commercially available from Nitta Haas Inc.) with a down force of 29.4 kPa, a chemical mechanical polishing composition flow rate of 200 ml/min, a table rotation speed of 115 rpm and a carrier rotation speed of 100 rpm. The silicon removal rates were determined from a measurement of the weight loss from the individual Si(100) wafers from the polishing. The results of the silicon removal rate experiments are provided in TABLE 5.

TABLE 5

| Polish Example # | Polish Time (in min.) | Wafer Count in series of consecutive wafers | Si(100) removal rate (nm/min) |
|---|---|---|---|
| P2 | 30 | 1* | 736 |
|  | 30 | 2* | 743 |
|  | 15 | 3 | 743 |
|  | 15 | 4 | 742 |
|  | 15 | 5 | 745 |
|  | 15 | 6 | 728 |
|  | 15 | 7 | 745 |
|  | 15 | 8 | 740 |
|  | 15 | 9 | 734 |
|  | 15 | 10** | 733 |
|  | 15 | 11 | 695 |
|  | 15 | 12** | 510 |

*Denotes the silicon wafer was pre-etched in a 2 wt % hydrofluoric acid solution for 30 seconds before installing in the polisher.
**Denotes that the polishing pad was conditioned with a brush before commencing polishing on the silicon wafer.

We claim:

1. A method of polishing a silicon wafer, comprising:
providing a silicon wafer;
providing a chemical mechanical polishing composition, comprising:
water;
optionally, an abrasive;
a cation according to formula (I):

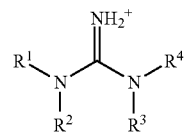

(I)

wherein $R^1$, $R^2$, $R^3$, $R^4$ are independently selected from the group consisting of a hydrogen and a $C_{1-10}$ alkyl group, a $C_{1-10}$ aryl group, a $C_{1-10}$ arylalkyl group and a $C_{1-10}$ alkylaryl group; and,
piperazine or a piperazine derivative according to formula (II)

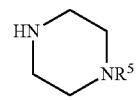

(II)

wherein $R^5$ is selected from the group consisting of a hydrogen, a $C_{1-10}$ alkyl group, a $C_{1-10}$ aryl group, a $C_{1-10}$ arylalkyl group and a $C_{1-10}$ alkylaryl group; and,
a quaternary ammonium compound selected from the group consisting of tetramethyl ammonium hydroxide, tetraethyl ammonium hydroxide, tetrapropyl ammonium hydroxide, tetraisopropyl ammonium hydroxide, tetracyclopropyl ammonium hydroxide, tetrabutyl ammonium hydroxide, tetraisobutyl ammonium hydroxide, tetra tert-butyl ammonium hydroxide, tetra sec-butyl ammonium hydroxide, tetracyclobutyl ammonium hydroxide, tetrapentyl ammonium hydroxide, tetracyclopentyl ammonium hydroxide, tetrahexyl ammonium hydroxide, tetracyclohexyl ammonium hydroxide, and mixtures thereof;
wherein the chemical mechanical polishing composition exhibits a pH of 9 to 12; and, wherein the chemical mechanical polishing composition exhibits a silicon removal rate of at least 300 nm/min;
providing a chemical mechanical polishing pad;
providing a polishing machine;
installing the silicon wafer and the chemical mechanical polishing pad in the polishing machine;
creating dynamic contact at an interface between the chemical mechanical polishing pad and the silicon wafer with a down force of ≥0.5 kPa; and
dispensing the chemical mechanical polishing composition onto the chemical mechanical polishing pad at or near the interface between the chemical mechanical polishing pad and the silicon wafer;
wherein the chemical mechanical polishing composition exhibits a stable silicon removal rate of at least 675 nm/min with a platen speed of 115 revolutions per minute, a carrier speed of 100 revolutions per minute, a chemical mechanical polishing composition flow rate of 200 ml/min, and a nominal down force of 29.4 kPa on a polishing machine with a 500 mm platen, wherein the chemical mechanical polishing pad used comprises a polyurethane impregnated, non-woven polyester felt pad.

2. The method of claim 1, wherein the chemical mechanical polishing composition provided contains <1 ppm of polymers.

3. The method of claim 1, wherein the chemical mechanical polishing composition provided further comprises at least one of carbonate ions and phosphate ions.

4. The method of claim 3, wherein the chemical mechanical polishing composition provided further comprises:
halide ions.

5. A method of polishing a silicon wafer, comprising:
providing a silicon wafer;
providing a chemical mechanical polishing composition, comprising:
water;
0.00001 to 0.5 wt % of an abrasive;
a cation according to formula (I):

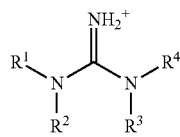

(I)

wherein $R^1$, $R^2$, $R^3$, $R^4$ are independently selected from the group consisting of a hydrogen and a $C_{1-10}$ alkyl group, a $C_{1-10}$ aryl group, a $C_{1-10}$ arylalkyl group and a $C_{1-10}$ alkylaryl group; and,
piperazine or a piperazine derivative according to formula (II)

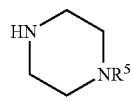

(II)

wherein $R^5$ is selected from the group consisting of a hydrogen, a $C_{1-10}$ alkyl group, a $C_{1-10}$ aryl group, a $C_{1-10}$ arylalkyl group and a $C_{1-10}$ alkylaryl group; and, a quaternary ammonium compound selected from the group consisting of tetramethyl ammonium hydroxide, tetraethyl ammonium hydroxide, tetrapropyl ammonium hydroxide, tetraisopropyl ammonium hydroxide, tetracyclopropyl ammonium hydroxide, tetrabutyl ammonium hydroxide, tetraisobutyl ammonium hydroxide, tetra tert-butyl ammonium hydroxide, tetra sec-butyl ammonium hydroxide, tetracyclobutyl ammonium hydroxide, tetrapentyl ammonium hydroxide, tetracyclopentyl ammonium hydroxide, tetrahexyl ammonium hydroxide, tetracyclohexyl ammonium hydroxide, and mixtures thereof;
wherein the chemical mechanical polishing composition exhibits a pH of 9 to 12; and, wherein the chemical mechanical polishing composition exhibits a silicon removal rate of at least 300 nm/min;
providing a chemical mechanical polishing pad;
providing a polishing machine;
installing the silicon wafer and the chemical mechanical polishing pad in the polishing machine;
creating dynamic contact at an interface between the chemical mechanical polishing pad and the silicon wafer with a down force of ≥0.5 kPa; and
dispensing the chemical mechanical polishing composition onto the chemical mechanical polishing pad at or near the interface between the chemical mechanical polishing pad and the silicon wafer;
wherein the chemical mechanical polishing composition exhibits a stable silicon removal rate of at least 675 nm/min with a platen speed of 115 revolutions per minute, a carrier speed of 100 revolutions per minute, a chemical mechanical polishing composition flow rate of 200 ml/min, and a nominal down force of 29.4 kPa on a polishing machine with a 500 mm platen, wherein the chemical mechanical polishing pad used comprises a polyurethane impregnated, non-woven polyester felt pad.

6. The method of claim 5, wherein the chemical mechanical polishing composition provided contains <1 ppm of polymers.

7. The method of claim 5, wherein the chemical mechanical polishing composition provided further comprises at least one of carbonate ions and phosphate ions.

8. The method of claim 5, wherein the chemical mechanical polishing composition provided further comprises:
halide ions.

* * * * *